United States Patent
Park

Patent Number: 5,608,688
Date of Patent: Mar. 4, 1997

[54] DRAM HAVING OUTPUT CONTROL CIRCUIT

[75] Inventor: Sung M. Park, Seoul, Rep. of Korea

[73] Assignee: LG Semicon Co., Ltd., Cheongju, Rep. of Korea

[21] Appl. No.: 588,170

[22] Filed: Jan. 18, 1996

[30] Foreign Application Priority Data

Oct. 5, 1995 [KR] Rep. of Korea .................. 34094/1995

[51] Int. Cl.[6] .................................................. G11C 7/06
[52] U.S. Cl. .................................. 365/233.5; 365/230.08; 365/194
[58] Field of Search .................... 365/233.5, 230.08, 365/194, 233, 189.01

[56] References Cited

U.S. PATENT DOCUMENTS

| | | | |
|---|---|---|---|
| 5,268,873 | 12/1993 | Suzuki | 365/233.5 |
| 5,331,595 | 7/1994 | Inoue | 365/233.5 |
| 5,345,421 | 9/1994 | Iwamura et al. | 365/233.5 |

*Primary Examiner*—David C. Nelms
*Assistant Examiner*—Vu A. Le
*Attorney, Agent, or Firm*—Fleshner & Kim

[57] ABSTRACT

A DRAM having an output control circuit for preventing undesired data from being outputted from the DRAM when an address is transited before a column address strobe signal is latched during DRAM read operation, and allowing desired data to be outputted from the DRAM when a global input/output data signal is precharged after the column address strobe signal is latched.

8 Claims, 4 Drawing Sheets

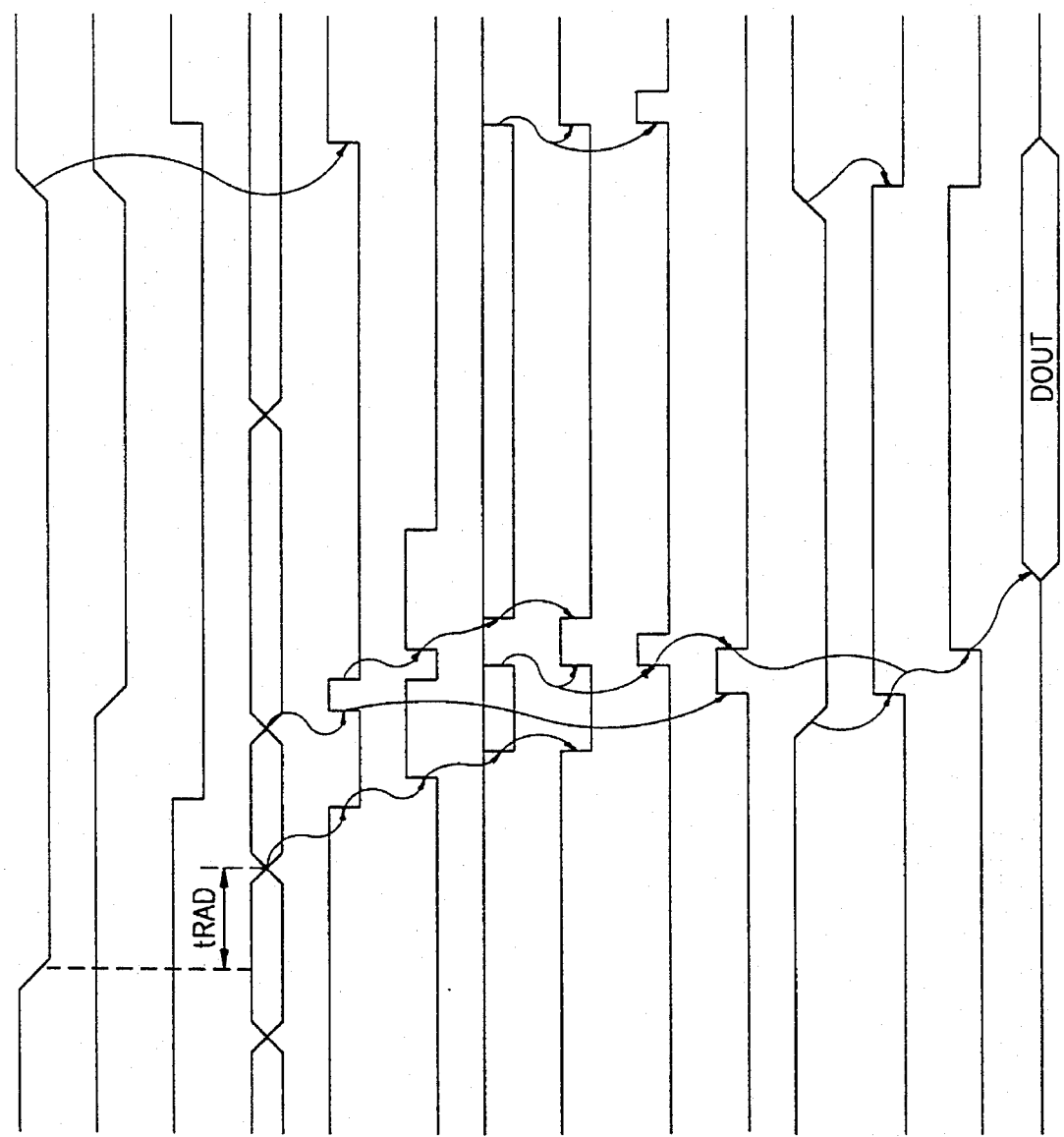

DRAM HAVING OUTPUT CONTROL CIRCUIT

BACKGROUND OF THE INVENTION

1. Field of the Invention

The present invention relates to a dynamic random access memory (hereinafter referred to as "DRAM"), and particularly to a DRAM having an output control circuit for preventing undesired data from being outputted from the DRAM when an address is transited before a column address strobe signal is latched during DRAM read operation, and allowing desired data to be outputted from the DRAM when a global input/output data signal is precharged after the column address strobe signal is latched.

2. Description of the Conventional Art

Referring to FIG. 1, a conventional DRAM includes a row address buffer 10 for outputting a row address signal RADS in accordance with a row address strobe signal /RAS and an address signal ADS; a column address buffer 20 for outputting a column address signal CADS and an address transition detecting signal ATD in accordance with the address signal ADS, the row address strobe signal/RAS and a column address strobe signal/CAS; a row decoder 30 for outputting word line selection signals WLo to WLn by decoding the row address signal RADS outputted from the row address buffer 10; a column decoder 40 for outputting column selection signals YSELo to YSELm in accordance with the column address signal CADS and address transition detecting signal ATD outputted from the column address buffer 20; a memory cell 50 for outputting the stored data in accordance with the word line selection signals WL0 to WLn; first and second sense amplifiers 51 and 52 for amplifying the data outputted from the memory cell array 50, and outputting the amplified data in accordance with the column selection signals YSEL0 to YSELm outputted from the column decoder 40; a data bus sense amplifier 60 for amplifying the data outputted from the first and second sense amplifiers 51 and 52, and outputting the signals of the amplified data, i.e., first and second global input/output data signals GIO and GIO*; and an output buffer 70 for latching the first and second global input/output data signals GIO and GIO* outputted from the data bus sense amplifier 60, and outputting the latched signals from the DRAM in accordance with an output enable signal /OE.

Here, the DRAM is referred to only in case where the data stored in the memory cell array 50 is outputted. The memory cell array 50 includes a plurality of cells each storing the digital data.

The operations of the conventional DRAM are explained, referring to the drawings.

When an address signal ADS is commonly inputted to the row address buffer 10 and the column address buffer 30 as shown in FIG. 2C, and the row address strobe signal /RAS is transited from high level to low level, and becomes in active state, as shown in FIG. 2A, the row address signal RADS is latched by the row address buffer 10 and outputted to the row decoder 30. Next, the row address signal RADS is decoded by the row decoder 30, and word line selection signals WL0 to WLn corresponding to the decoded row address signals are outputted to the memory cell array 50, thereby the data of the memory cells are amplified in the first and second sense amplifiers 51 and 52.

Here, when a predetermined time tRAD elapses after the row address strobe signal /RAS is transited from high level to low level, the address signal ADS is regarded as the column address signal CADS by the column address buffer 20.

Accordingly, when the address signal ADS is transited after the lapse of a predetermined time, where the address strobe signal CAS is not in active state, the column address signal CADS and the address transition detecting signal ATD transited from high level to low level, as shown in FIG. 2D, are outputted to the column decoder 40, respectively.

Afterwards, the column address signal CADS is decoded by the column decoder 40, and the column selection signal YSELi (where, i=0, 1, ..., m) corresponding to the decoded column address signal is outputted to the first sense amplifier 51 or the second sense amplifier 52, as shown in FIG. 2E, thereby data amplified by the first sense amplifier 51 or the second sense amplifier 52 is outputted to the data bus sense amplifier 60.

The data bus sense amplifier 60 amplifies the inputted data, and outputs to the output buffer 70 the first and second global input/output data signals GIO and GIO* of low level, as shown in FIG. 2F. Here, in a state precharged to high level, when the data outputted from the data bus sense amplifier 60 is "1", the first global input/output data signal GIO is transited to low level, whereas, the data outputted from the data bus sense amplifier 60 is "0", the second global input/output data signal GIO* is transited to low level.

At this time, when the output enable signal /OE is transited to low level, as shown in FIG. 2G, a signal Dout1 of undesired data latched in the output buffer 70 is outputted from the DRAM, as shown in FIG. 2H.

On the other hand, when the address signal ADS is transited again, as shown in FIG. 2C, and the column address strobe signal /CAS is transited to low level and in active state, as shown in FIG. 2B, the column address signal CADS latched by the column address buffer 20 and the address transition detecting signal ATD, i.e., pulse signal of high level are outputted to the column decoder 30, respectively.

When the address transition detecting signal ATD is transited to low level, the column selection signal YSELi (where, i=0, 1, ..., m) corresponding to the decoded value of the column address signal CADS is outputted to the first sense amplifier 51 or the second sense amplifier 52, as shown in FIG. 2E, and the data amplified by the first sense amplifier 51 or the second sense amplifier 52 is outputted to the data bus sense amplifier 60.

Next, the data bus sense amplifier 60 amplifies the inputted data, and outputs to the output buffer 70 the first and second global input/output data signals GIO and GIO* of low level, as shown in FIG. 2F.

At this time, as shown in FIG. 2G, since the output enable signal /OE is maintained in low level, a signal Dout2 of desired data latched in the output buffer 70 is outputted from the DRAM, as shown in FIG. 2H.

Here, when the row address strobe signal /RAS and the column address strobe signal /CAS are transited to high level, the address transition detecting signal ATD is transited to high level.

However, the conventional DRAM has a problem in that undesired data is outputted from the DRAM when an address is transited before a column address strobe signal is in active state. Further, since the undesired data is outputted, there occurs a problem of waste of electric power.

SUMMARY OF THE INVENTION

Therefore, it is object of the present invention to provide a DRAM having an output control circuit for preventing undesired data from being outputted from the DRAM during DRAM read operation.

To achieve the above object, the DRAM includes a row address buffer for outputting a row address signal and a delay signal in accordance with a row address strobe signal and an address signal; a column address buffer for outputting a column address signal and an address transition detecting signal in accordance with the address signal, the row address strobe and a column address strobe signal; a row decoder for outputting a word line selection signal by decoding the row address signal; a column decoder for outputting a column selection signal in accordance with the column address signal and the address transition detecting signal; a memory cell array for outputting the stored data in accordance with the word line selection signal; first and second sense amplifiers for amplifying the signal of data outputted from the memory cell array and outputting the signal of the amplified data in accordance with the column selection signal outputted from the column decoder; a data bus sense amplifier for amplifying the signal of data outputted from the first and second sense amplifiers, and outputting the signals of the amplified data, i.e., first and second global input/output data signals and the global data bus precharge pulse signal, respectively; a data bus sense amplifier controller for outputting to the data bus sense amplifier the global data bus precharge signal which is maintained in high level when the first and second global input/output data signals outputted from the data bus sense amplifier are in precharge state; an output control circuit for receiving the delay signal outputted from the row address buffer, the address transition detecting signal outputted from the column address buffer, and the global data bus precharge pulse signal, and outputting an output control signal to control the undesired data not to be outputted; and an output buffer for outputting a desired data from the DRAM when the output control signal is enabled.

BRIEF DESCRIPTION OF THE DRAWINGS

The above object and advantages of the present invention will be more clearly understood from the following detailed description taken in conjunction with the accompanying drawings, in which:

FIGS. 2A to 2H are timing diagrams of FIG. 1, in which;

FIG. 2A is a waveform of a row address strobe signal in FIG. 1;

FIG. 2B is a waveform of a column address strobe signal in FIG. 1;

FIG. 2C is a waveform of an address signal in FIG. 1;

FIG. 2D is a waveform of an address transition detecting signal in FIG. 1;

FIG. 2E is a waveform of a column selection signal in FIG. 1;

FIG. 2F is a waveform of first and second global input/output data signals in FIG. 1;

FIG. 2G is a waveform of an output enable signal in FIG. 1; and

FIG. 2H is a waveform of data signal outputted from an output buffer in FIG. 1;

FIGS. 5A to 5N are timing diagrams of FIGS. 3 and 4, in which;

FIG. 5A is a waveform of a row address strobe signal in FIG. 3;

FIG. 5B is a waveform of a column address strobe signal in FIG. 3;

FIG. 5C is a waveform of delay signal in FIGS. 3 and 4;

FIG. 5D is a waveform of an address signal in FIG. 3;

FIG. 5E is a waveform of an address transition detecting signal in FIGS. 3 and 4;

FIG. 5F is a waveform of a column selection signal in FIG. 3;

FIG. 5G is a waveform of first and second global input/output data signals in FIG. 3;

FIG. 5H is a waveform of a global data bus precharge pulse signal in FIG. 3;

FIG. 5I is a waveform of a global data bus precharge pulse signal in FIGS. 3 and 4;

FIG. 5J is a waveform of an output enable latch signal in FIG. 4;

FIG. 5K is a waveform of an output enable signal in FIG. 4;

FIG. 5L is a waveform of an inverted output enable signal in FIG. 4;

FIG. 5M is a waveform of an output control signal in FIGS. 3 and 4; and

FIG. 5N is a waveform of data signal outputted from an output buffer in FIG. 3.

DETAILED DESCRIPTION OF THE PREFERRED EMBODIMENTS

Figure 1:
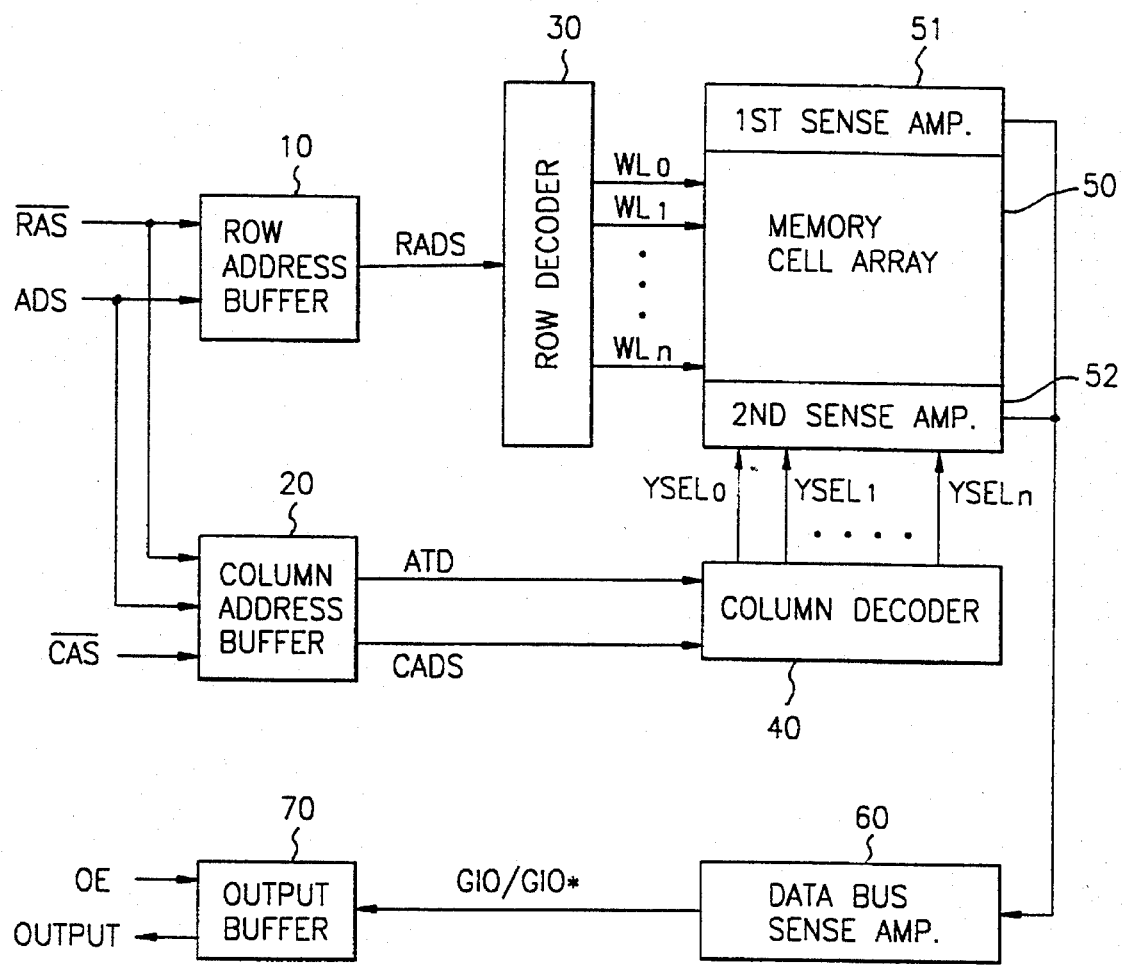
FIG. 1 is a block diagram of a conventional DRAM.
Figure 3:
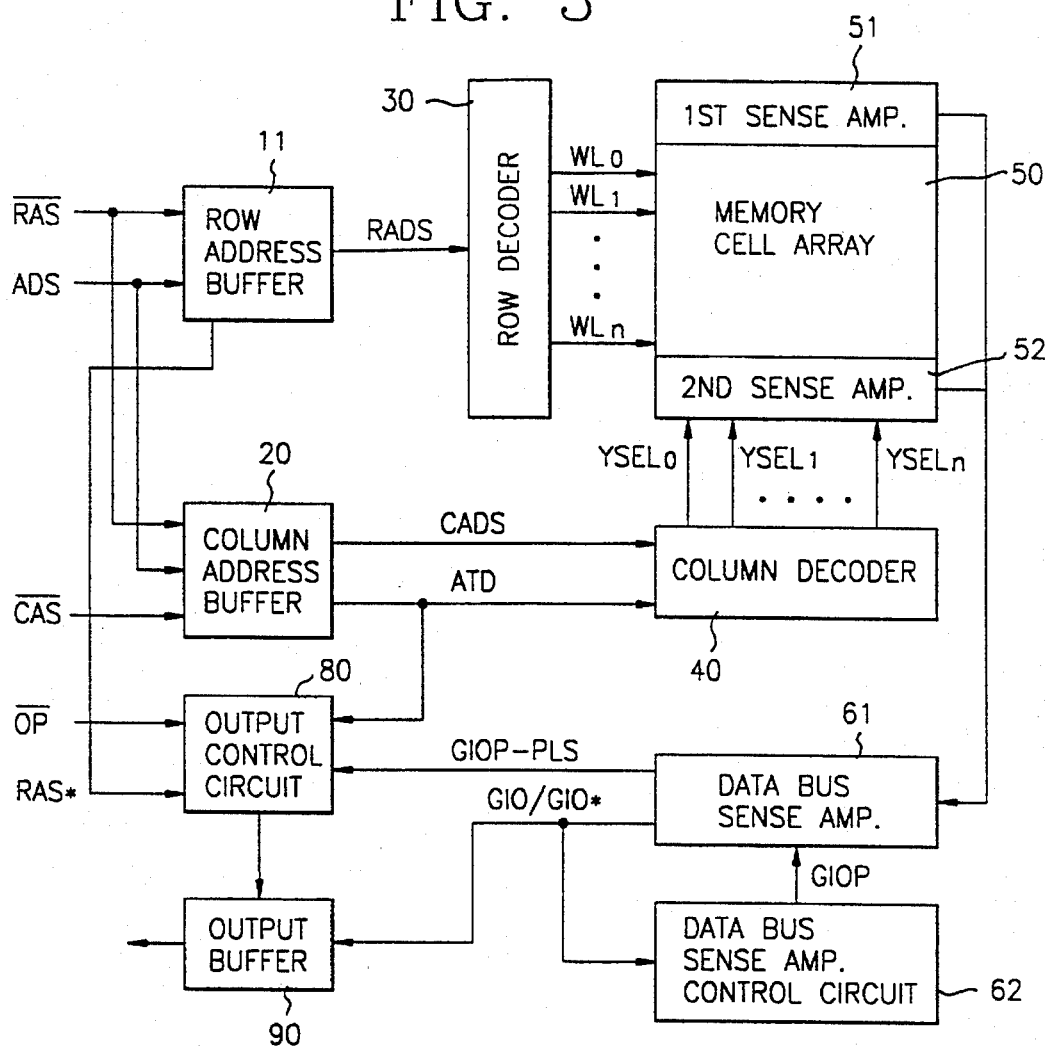
FIG. 3 is a block diagram of a DRAM in accordance with the present invention.

Referring to FIG. 3, the DRAM having an output control circuit according to the present invention is structurally the same as the DRAM of FIG. 1, exclusive of a row address buffer 11, a data bus sense amplifier 61, a data bus sense amplifier controller, an output control circuit 80 and an output buffer 90.

Here, the row address buffer 11 is structurally the same as the address buffer 10 of FIG. 1, excluding that the row address buffer 11 outputs the delay signal RAS* to the output control signal 80.

Additionally, the data bus sense amplifier 61 outputs first and second global data bus signals GIO and GIO* to the output buffer 90 and the data bus sense amplifier controller 62. The data bus sense amplifier controller 62 outputs a global data bus precharge signal GIOP to the data bus sense amplifier 61, and the data bus sense amplifier 61 outputs the global data bus precharge pulse signal GIOP-PLS to the output control circuit 80.

Figure 4:
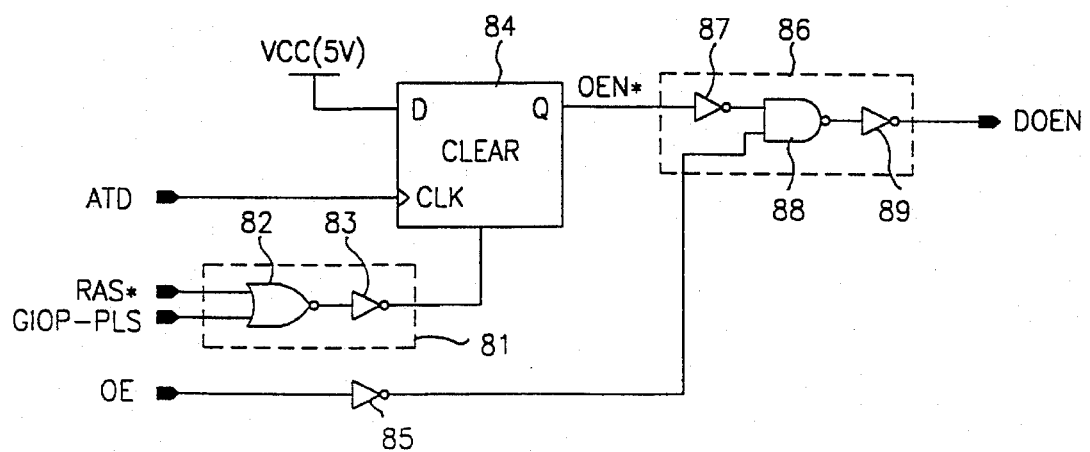
FIG. 4 is a detailed diagram of an output control circuit in FIG. 3.

As shown in FIG. 4, the output control circuit 80 includes a first logic operator 81 for logically operating the delay signal RAS* outputted from the row address buffer 11 and global data bus precharge pulse signal GIOP-PLS outputted from the data bus sense amplifier 61; Dflip-flop 84 having a clear terminal CLEAR to which the signal outputted from the first logic operator 81 is inputted, having a data terminal D to which a supply voltage VCC is inputted, and having a clock terminal CLK to which the address transition detecting signal ATD outputted from the column address buffer 20 is inputted, respectively, and outputting an output enable latch signal OEN* via its output terminal Q; a first inverter 85 for inverting an input enable signal /OE applied from the outside of the DRAM; and a second logic operator 86 for outputting an output control signal DOEN to the output buffer 90, by logically operating the inverted output enable signal OE outputted from the first inverter 85 and the output enable latch signal OEN* outputted from the Dflip-flop 84.

The first logic operator 81 includes a NOR gate for NORing the delay signal RAS* and the global data bus precharge pulse signal GIOP-PLS; and a second inverter 83 for inverting the signal outputted from the NOR gate 82 and outputting the inverted signal to the clear terminal CLEAR of the Dflip-flop 84.

Here, the first logic operator 81 can include an OR gate for ORing the delay signal RAS* and the global data bus precharge pulse signal GIOP-PLS, and outputting the ORed signal to the clear terminal CLEAR of the Dflip-flop 84.

The second logic operator 86 includes a third inverter 87 for inverting the output enable latch signal OEN* outputted from the Dflip-flop 84; a NAND gate 88 for NANDing the signal outputted from the third inverter 87 and the inverted output enable signal /OE outputted from the first inverter 85; and a fourth inverter 89 for inverting the signal outputted from the NAND gate 88 and outputting the output control signal DOEN to the output buffer 90.

Here, the second logic operator 86 can include a third inverter 87 for inverting the output enable latch signal OEN* outputted from the Dflip-flop 84; and an AND gate for ANDing the signal outputted from the third inverter 87 and the inverted output enable signal /OE outputted from the first inverter 85, and outputting the output control signal DOEN to the output buffer 90.

The output buffer 90 latches the first and second input/output data signals GIO and GIO* outputted from the data bus sense amplifier 61, and then outputs the latched signals from the DRAM in accordance with the output control signal DOEN outputted from the output control circuit 80.

The operations of the present invention will be explained in detail, referring to FIG. 5.

Figure 2:
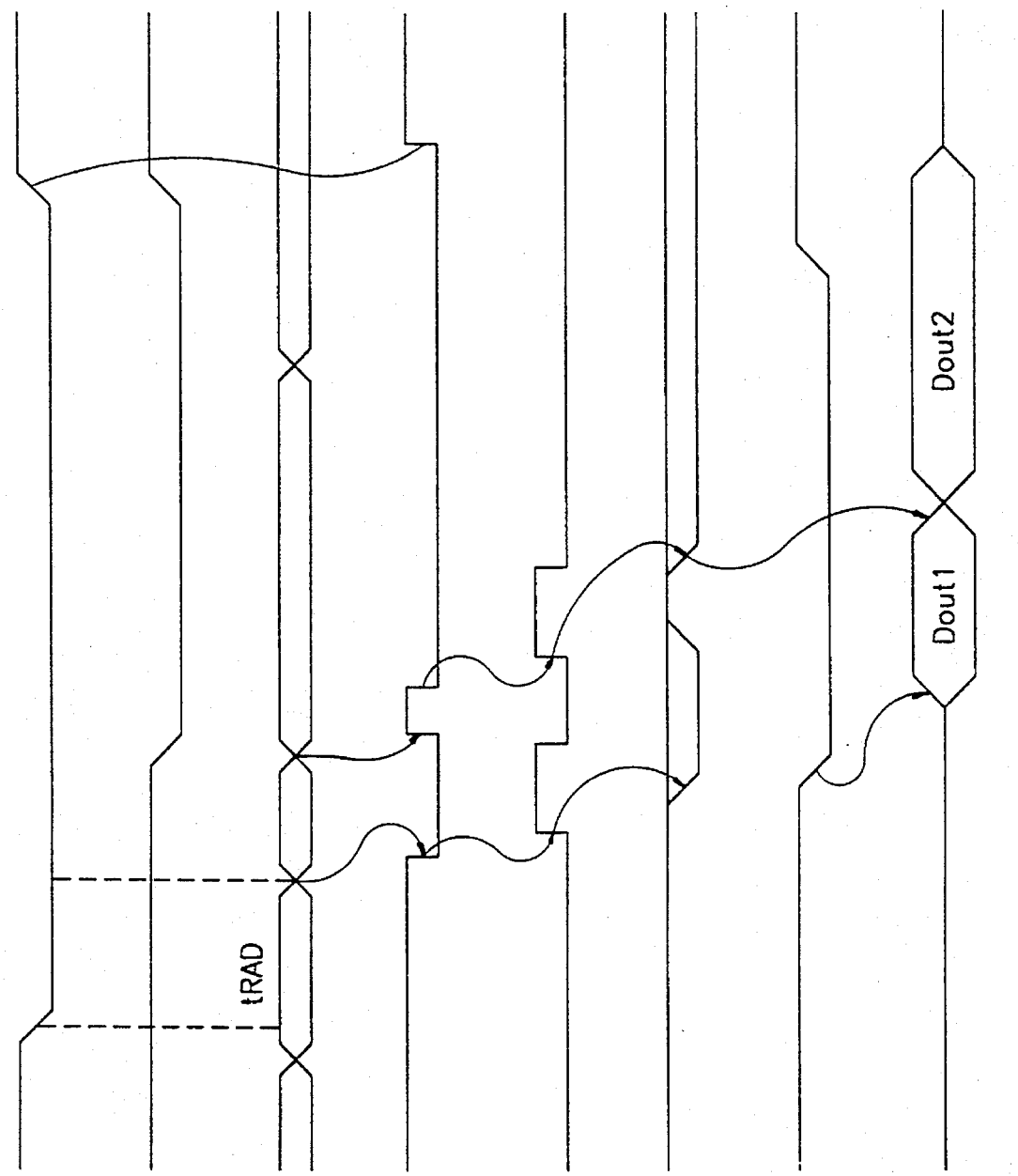

The row address strobe signal /RAS and the column address strobe signal /CAS shown in FIGS. 5A and 5B, and the address signal ADS, the address transition detecting signal ATD and the column selection signal YSELi shown in FIGS. 5C to 5G, are processed in accordance with the steps illustrated in FIGS. 1 and 2, thereby the data amplified by the first sense amplifier 51 or the second sense amplifier 52 is outputted to the data bus sense amplifier 61.

Further, as shown in FIG. 5C, the delay signal RAS*, i.e., delayed signal of the row address strobe signal /RAS in a predetermined time tRAD is outputted to the output control circuit 80 by the row address buffer 11.

As shown in FIG. 5H, the data bus sense amplifier controller 62 outputs to the data bus sense amplifier 61 the global data bus precharge signal GIOP which is maintained in a low level when the first and second global input/output data signals GIO and GIO* are transited to low level, and is transited to high level when the signals are in a state precharged to high level. And, the data bus sense amplifier 61 outputs to the output control circuit 80 the global data bus precharge pulse signal GIOP-PLS, i.e., the pulse signal of high level generated when the global data bus precharge signal GIOP maintained in low level is transited to high level, as shown in FIG. 5I.

Next, the Dflip-flop 84 of the output control circuit 80 latches a supply voltage of 5 V applied to the data terminal D when the address transition detecting signal ATD is transited to high level, as shown in FIG. 4, thereby outputting the output enable latch signal OEN* to the second logic operator 86, as shown in FIG. 5J.

At this time, when the global data bus precharge pulse signal GIOP-PLS outputted from the data bus sense amplifier 61 is transited to high level, the global data bus precharge pulse signal GIOP-PLS of high level and the delay signal RAS* of low level are operated in the NOR gate 82 of the first logic operator 81 and in the second inverter 83, successively, thereby signal of low level is inputted to the clear terminal CLEAR of the Dflip-flop 84.

Accordingly, the Dflip-flop 84 is cleared, and outputs the output enable latch signal OEN* of low level to the second logic operator 86, as shown in FIG. 5J.

When the output enable signal OE is transited to low level, as shown in FIG. 5K, the signal of low level is inverted by the first inverter 85 and the inverted output enable signal OE is inputted to the second logic operator 86, as shown in FIG. 5L.

Thereafter, the output enable latch signal OEN* is inverted by the third inverter 87 of the second logic operator 86, and the inverted output enable latch signal OEN* and the inverted output enable signal OE are NANDed by the NAND gate 88. Further, the NANDed signal is inverted by the fourth inverter 89, thereby outputting the output control signal DOEN of high level to the output buffer 90, as shown in FIG. 5M.

Accordingly, the output buffer 90 outputs the signal Dout of desired data from the DRAM, as shown in FIG. 5N.

As described above, the DRAM according to the present invention controls data not to be outputted, even though the address signal is transited before the column address strobe signal is in active state, and has an effect on preventing waste of electric power necessary for outputting an unnecessary data.

What is claimed is:

1. A DRAM having an output control circuit comprises;

a row address buffer for outputting a row address signal and a delay signal in accordance with a row address strobe signal and an address signal;

a column address buffer for outputting a column address signal and an address transition detecting signal in accordance with said address signal, row address strobe and a column address strobe signal;

a row decoder for outputting a word line selection signal by decoding said row address signal;

a column decoder for outputting a column selection signal in accordance with said column address signal and the address transition detecting signal;

a memory cell array for outputting the stored data in accordance with said word line selection signal;

first and second sense amplifiers for amplifying the signal of data outputted from said memory cell array and outputting the signal of the amplified data in accordance with said column selection signal outputted from said column decoder;

a data bus sense amplifier for amplifying the signal of data outputted from said first and second sense amplifiers, and outputting the signals of the amplified data, i.e., first and second global input/output data signals and a global data bus precharge pulse signal, respectively;

a data bus sense amplifier controller for outputting to said data bus sense amplifier the global data bus precharge signal which is maintained in high level when said first and second global input/output data signals outputted from said data bus sense amplifier are in precharge state;

an output control circuit for receiving said delay signal outputted from said row address buffer, address transition detecting signal outputted from said column address buffer, and global data bus precharge pulse signal, and outputting an output control signal to control the undesired data not to be outputted; and an output buffer for outputting a desired data from the DRAM when the output control signal is enabled.

2. The DRAM of claim 1, wherein said output control circuit comprises;

a first logic operator for logically operating said delay signal and global data bus precharge pulse signal;

a flip-flop for being cleared in accordance with a signal outputted from said first logic operator, being synchronized in accordance with said address transition detecting signal, and latching an output enable latch signal;

a first inverter for inverting an input enable signal applied from the outside of the DRAM; and a second logic operator for outputting an output control signal to said output buffer, by logically operating the inverted output enable signal outputted from said first inverter and the output enable latch signal.

3. The DRAM of claim 1, wherein said delay signal is a delayed signal of said row address strobe signal for a predetermined time.

4. The DRAM of claim 1, wherein said global data bus precharge pulse signal is transited from low level to high level and maintained in a high level for a predetermined time, when said global data bus precharge signal is transited from low level to high level.

5. The DRAM of claim 2, wherein said flip-flop includes a Dflip-flop having a clear terminal to which a signal outputted from said first logic operator is inputted, a data terminal to which a supply voltage of high level is inputted, and a clock terminal to which said address transition detecting signal is inputted, respectively, and outputting said output enable latch signal to said second logic operator via its output terminal.

6. The DRAM of claim 2, wherein said first logic operator includes a NOR gate for NORing said delay signal and the global data bus precharge pulse signal; and a second inverter for inverting the signal outputted from said NOR gate and outputting the inverted signal to said clear terminal of said flip-flop.

7. The DRAM of claim 2, wherein said first logic operator 81 can include an OR gate for ORing said delay signal and global data bus precharge pulse signal and outputting the ORed signal to said clear terminal of said flip-flop.

8. The DRAM of claim 2, wherein said second logic operator includes a third inverter for inverting said output enable latch signal outputted from said flip-flop; a NAND gate for NANDing the signal outputted from said third inverter and the inverted output enable signal outputted from said first inverter; and a fourth inverter for inverting the signal outputted from said NAND gate and outputting the output control signal to said output buffer.

* * * * *